(12) United States Patent
Takada et al.

(10) Patent No.: US 9,049,808 B2
(45) Date of Patent: Jun. 2, 2015

(54) PRINTED WIRING BOARD AND A METHOD OF MANUFACTURING A PRINTED WIRING BOARD

(75) Inventors: Masaru Takada, Ogaki (JP); Fusaji Nagaya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 13/213,199

(22) Filed: Aug. 19, 2011

(65) Prior Publication Data

US 2012/0043123 A1 Feb. 23, 2012

(30) Foreign Application Priority Data

Aug. 21, 2010 (JP) .................................. 2010-185684

(51) Int. Cl.
*H05K 1/16* (2006.01)
*H05K 3/46* (2006.01)
*H01L 23/498* (2006.01)

(52) U.S. Cl.
CPC ......... *H05K 3/4602* (2013.01); *Y10T 29/49165* (2015.01); *H01L 23/49822* (2013.01); *H01L 23/49894* (2013.01); *H05K 2201/0209* (2013.01); *H05K 2201/09136* (2013.01); *H05K 2201/09827* (2013.01); *H05K 2201/09854* (2013.01); *H01L 2224/16227* (2013.01); *H01L 2924/15311* (2013.01); *H01L 2224/16225* (2013.01)

(58) Field of Classification Search
CPC ... H05K 3/3452; H05K 3/429; H05K 3/4602; H01L 2924/01079
USPC .......... 174/250, 255, 260, 262, 266; 361/792, 361/765
See application file for complete search history.

(56) References Cited

U.S. PATENT DOCUMENTS

| | | | | |
|---|---|---|---|---|
| 6,400,172 B1 * | 6/2002 | Akram et al. | ............ | 324/756.05 |
| 7,745,515 B2 * | 6/2010 | Tzou | .............. | 523/428 |
| 7,786,390 B2 * | 8/2010 | Ikeda | ............. | 174/255 |
| 8,129,625 B2 * | 3/2012 | Kato | ............. | 174/260 |
| 2003/0066683 A1 * | 4/2003 | Suzuki et al. | ................. | 174/262 |
| 2010/0006324 A1 * | 1/2010 | Kitamura et al. | ............. | 174/255 |
| 2010/0065318 A1 * | 3/2010 | Nagasawa et al. | ............ | 174/260 |
| 2011/0048775 A1 * | 3/2011 | Ishida et al. | .................. | 174/258 |

(Continued)

FOREIGN PATENT DOCUMENTS

| | | |
|---|---|---|
| CN | 1957649 A | 5/2007 |
| CN | 101352109 A | 1/2009 |
| CN | 101720165 A | 6/2010 |
| JP | 2001-274556 | 10/2001 |
| JP | 2004-281695 | 10/2004 |
| JP | 2007-329441 | 12/2007 |

(Continued)

*Primary Examiner* — Yuriy Semenenko
*Assistant Examiner* — Pete Lee
(74) *Attorney, Agent, or Firm* — Oblon, McClelland, Maier & Neustast, L.L.P.

(57) ABSTRACT

[Subject Matter] To provide a printed wiring board in which no warping occurs even if interlayer insulation layers without core material are laminated on a core substrate.

[Solution(s)] To lower the thermal expansion coefficient (CTE) to 20~40 ppm, inorganic particles are added to core substrate 30 formed by impregnating glass-cloth core material with glass-epoxy resin. Furthermore, thickness (a) of core substrate 30 is set at 0.2 mm, thickness (b) of upper-surface-side first interlayer insulation layer (50A) at 0.1 mm, and thickness (c) of lower-surface-side second interlayer insulation layer (50B) at 0.1 mm. In setting so, using thin core substrate 30 and interlayer insulation layers (50A, 50B) without core material, it is thought that warping does not occur in the printed wiring board.

25 Claims, 12 Drawing Sheets

(56) References Cited

U.S. PATENT DOCUMENTS

2011/0073358 A1* 3/2011 Hayashi .................. 174/258
2011/0100691 A1* 5/2011 Yugawa .................. 174/260

FOREIGN PATENT DOCUMENTS

| JP | 2008-244189 | 10/2008 |
| JP | 2008-277721 | 11/2008 |

* cited by examiner

FIG. 3
(A)
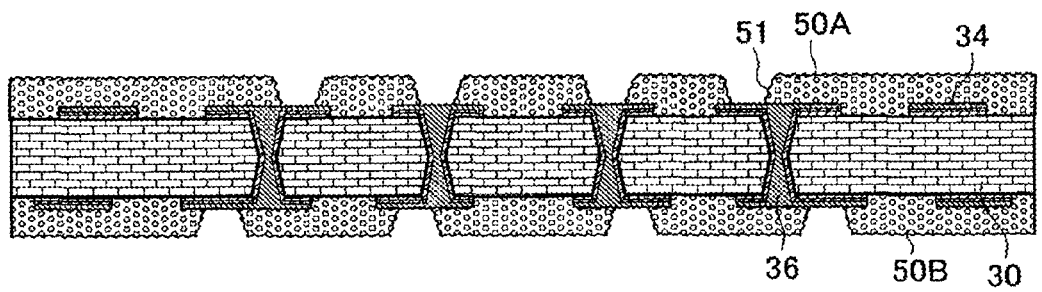
(B)
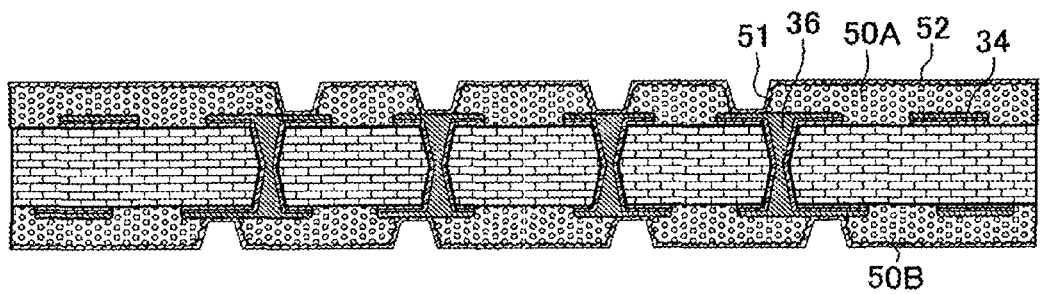
(C)
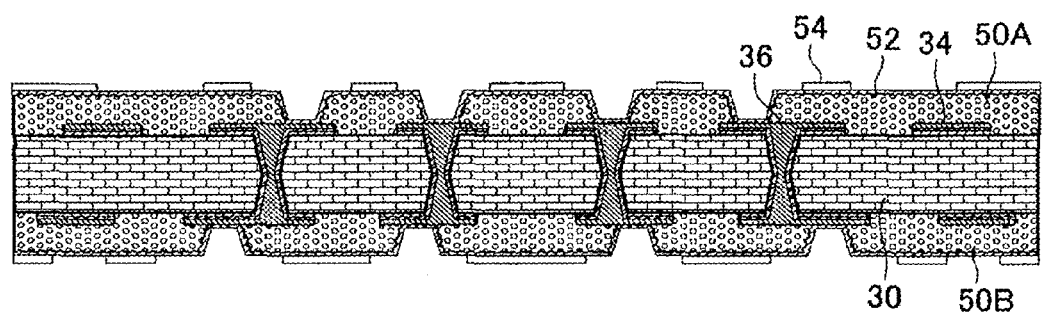

FIG. 4
(A)
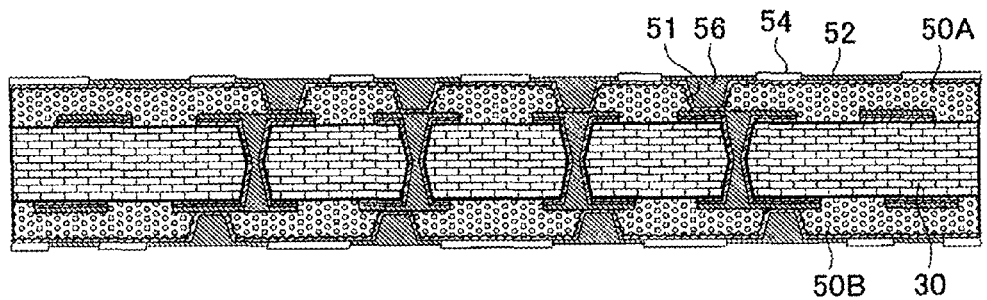
(B)
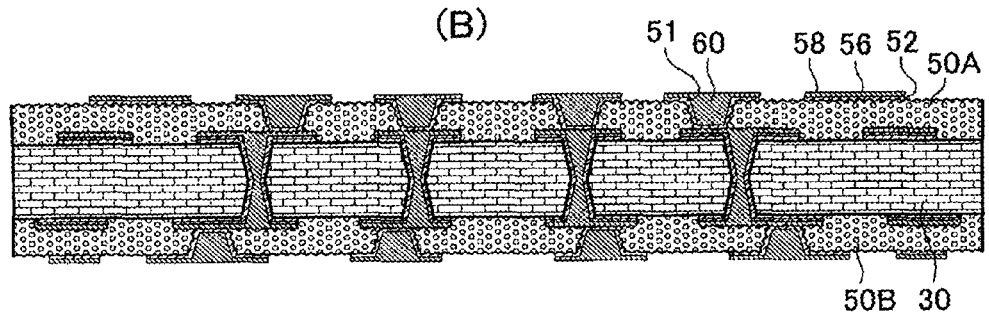
(C)
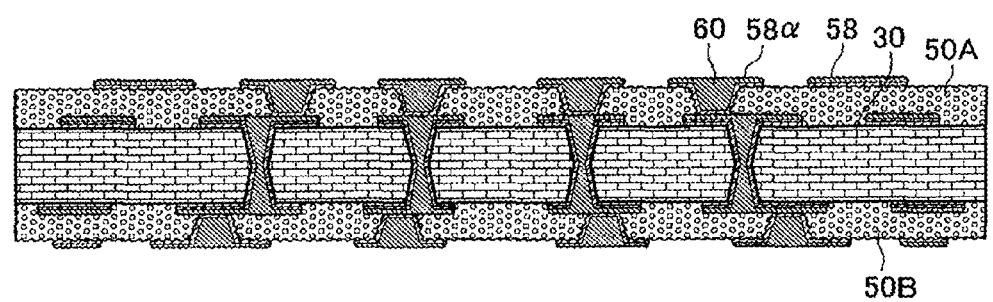

FIG. 5
(A)
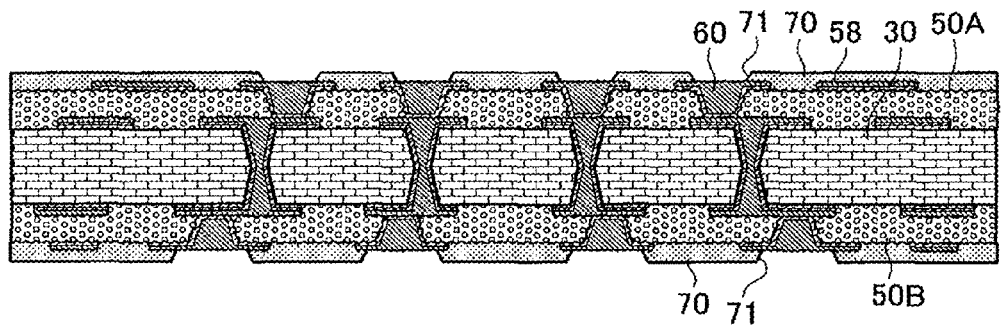
(B)
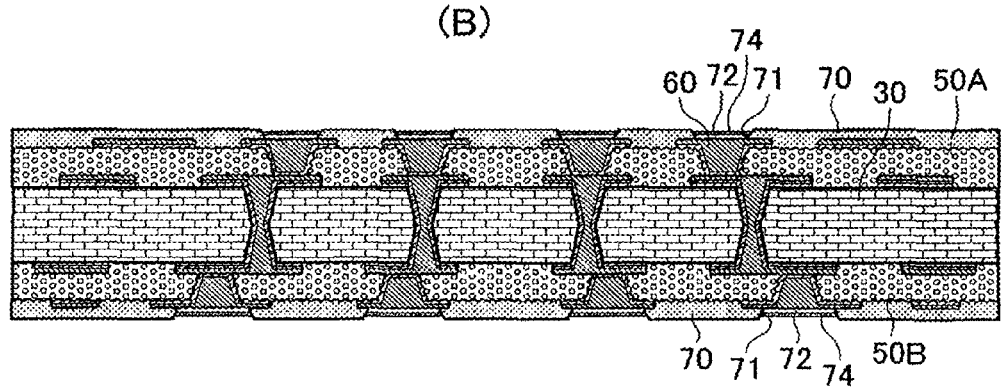
(C)
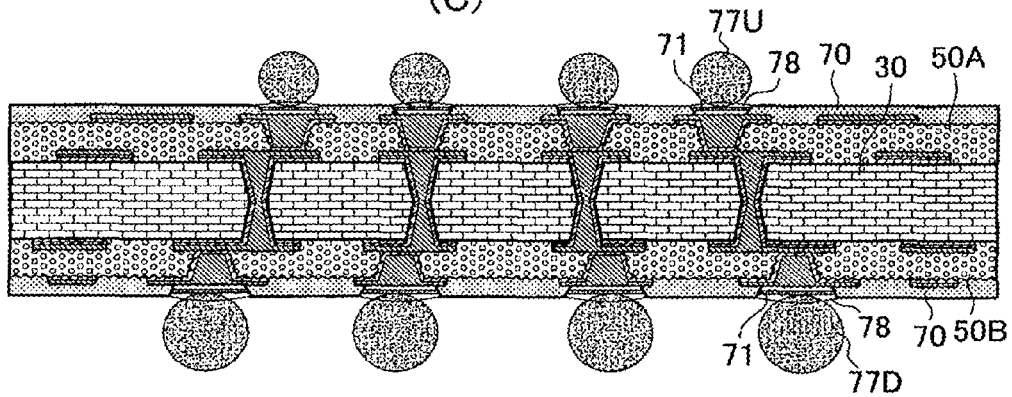

FIG. 10
(A)
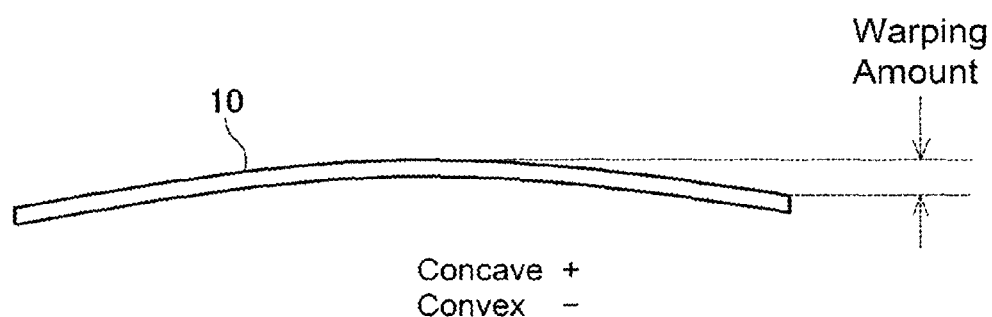
Concave +
Convex −
(B)
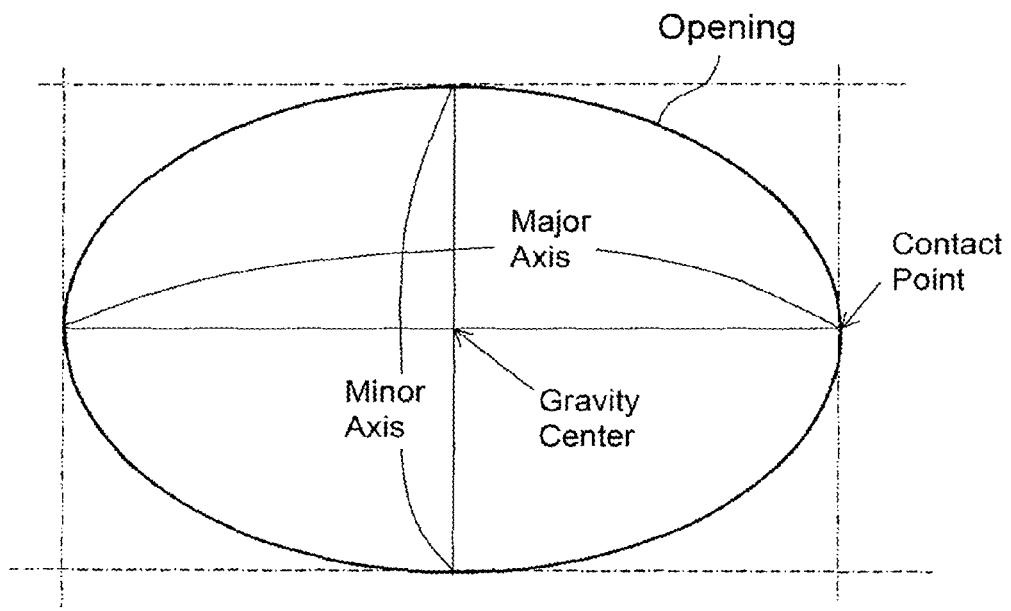

FIG. 11

| | core | | | interlayer thickness b (mm) | interlayer thickness c (mm) | CTE/(E*(a+b+c)) $10^{-6}$/GPa·mm·K | PKG warping amount (260°C) | warping direction | resin | | | glass cloth | filter | |
|---|---|---|---|---|---|---|---|---|---|---|---|---|---|---|
| | CTE ppm | E Gpa | thickness a (mm) | | | | | | type | resin amount | | type | type | amount |
| example 2-1 | 8.61 | 19.1 | 0.15 | 0.03 | 0.03 | 2.15 | 81 μm | concave | BT | 30% | | S glass | SiO2 | 30% |
| example 2-2 | 6.18 | 26 | 0.1 | 0.04 | 0.04 | 1.32 | 79 μm | concave | denatured epoxy | 20% | | S glass | SiO2 | 30% |
| example 2-3 | 6.18 | 26 | 0.15 | 0.03 | 0.03 | 1.13 | 70 μm | concave | denatured epoxy | 20% | | S glass | SiO2 | 30% |
| example 2-4 | 6.18 | 26 | 0.2 | 0.04 | 0.04 | 0.85 | 64 μm | concave | denatured epoxy | 20% | | S glass | SiO2 | 30% |
| example 2-5 | 6.18 | 26 | 0.25 | 0.03 | 0.03 | 0.77 | 61 μm | concave | denatured epoxy | 20% | | S glass | SiO2 | 30% |
| example 2-6 | 6.18 | 26 | 0.3 | 0.025 | 0.025 | 0.68 | 55 μm | concave | denatured epoxy | 20% | | S glass | SiO2 | 30% |
| example 2-7 | 6.18 | 26 | 0.25 | 0.04 | 0.04 | 0.72 | 56 μm | concave | denatured epoxy | 20% | | S glass | SiO2 | 30% |
| example 2-8 | 8.61 | 19.1 | 0.15 | 0.04 | 0.04 | 1.96 | 82 μm | concave | BT | 30% | | S glass | SiO2 | 30% |
| example 2-9 | 8.61 | 19.1 | 0.2 | 0.04 | 0.04 | 1.61 | 76 μm | concave | BT | 30% | | S glass | SiO2 | 30% |
| example 2-10 | 8.61 | 19.1 | 0.1 | 0.04 | 0.04 | 2.50 | 85 μm | concave | BT | 30% | | S glass | SiO2 | 30% |
| comp. example 1 | 12.21 | 9.6 | 0.1 | 0.04 | 0.04 | 7.07 | 161 μm | concave | denatured epoxy | 25% | | E glass | SiO2, Al2O3 | 25% |
| comp. example 2 | 12.35 | 13.2 | 0.1 | 0.04 | 0.04 | 5.20 | 136 μm | concave | BT | 25% | | E glass | SiO2 | 25% |
| comp. example 3 | 8.61 | 19.1 | 0.05 | 0.06 | 0.06 | 2.65 | 145 μm | concave | BT | 30% | | S glass | SiO2 | 30% |
| ref. example 1 | 6.18 | 26 | 0.5 | 0.04 | 0.04 | 0.41 | 51 μm | concave | denatured epoxy | 20% | | S glass | SiO2 | 30% |

FIG. 12

| Item | E-Glass | S-Glass |
|---|---|---|
| $SiO_2$ | 52~56 | 60~65 |
| $Al_2O_3$ | 12~16 | 20~23 |
| CaO | 15~25 | <0.01 |
| MgO | 3~6 | 9~11 |
| $B_2O_3$ | | <0.01 |
| Specific gravity | 2.54 | 2.49 |
| DK | 6.9 | 5.5 |
| Baitic module | 74 | 86 |
| Softening temp. | 840 | 970 |
| CTE | 4.5 | 2.4 |
| Drilling Suitability | ○ | ○~△ |

PRINTED WIRING BOARD AND A METHOD OF MANUFACTURING A PRINTED WIRING BOARD

TECHNICAL FIELD

The present invention relates to a printed wiring board having insulation layers formed on a core substrate where upper and lower surfaces are electrically connected by a through hole. Especially, the present invention relates to a printed wiring board that is suitably used as a package substrate for mounting an electronic component such as an IC chip, and to its manufacturing method.

BACKGROUND ART

A printed wiring board formed by laminating prepreg containing a core material on a core substrate containing a core material such as glass fiber is widely used as a package substrate for mounting an electronic component. Patent publication (1) discloses setting the elastic modulus of interlayer insulation layers made of prepreg to be lower than that of the core substrate in a composite substrate formed by laminating prepreg on a core substrate. Patent publication (2) discloses setting the thermal expansion coefficient of buildup layers to be 70 ppm/° C. or lower in a multilayer printed wiring board formed by laminating buildup layers on a core substrate. Patent publication (3) discloses setting the thermal expansion coefficient of interlayer insulation layers to be 35 ppm or lower in a multilayer circuit board formed by laminating single-sided substrates. Patent publication (4) discloses adjusting thicknesses of a core substrate and first and second interlayer insulation layers. Patent publication (5) discloses laminating on a printed wiring board a thermal expansion buffer sheet with a thermal expansion coefficient of 6~13 ppm.

PRIOR ART PUBLICATION

Patent Publication

[Patent Publication 1] Japanese Laid-Open Patent Publication No. 2007-329441
[Patent Publication 2] Japanese Laid-Open Patent Publication No. 2004-281695
[Patent Publication 3] Japanese Laid-Open Patent Publication No. 2008-277721
[Patent Publication 4] Japanese Laid-Open Patent Publication No. 2008-244189
[Patent Publication 5] Japanese Laid-Open Patent Publication No. 2001-274556

SUMMARY OF THE INVENTION

Problem(s) to be Solved by the Invention

In recent years, electronic components have been miniaturized and frequencies of IC chips have become 3 GHz or higher. Accordingly, fine-pattern wiring is required to respond to thinner-type IC mounting substrates and highly integrated wiring, and heat dissipation is necessary to reduce thermal stress caused by an increase of heat. Thus, thinner-type substrates are required, which do not result in warping when fine-pattern wiring is formed.

The present invention was carried out to solve the above-described problems. Its objective is to provide a printed wiring board and its manufacturing method so that no warping occurs when interlayer insulation layers without core material such as glass fiber are laminated on a core substrate.

Solution(s) to the Problem(s)

The present invention described in Claim 1 is a printed wiring board having the following: a core substrate with a first surface and a second surface opposite the first surface and having a penetrating hole; a first conductive circuit formed on the first surface of the core substrate; a second conductive circuit formed on the second surface of the core substrate; a through-hole conductor formed in the penetrating hole and connecting the first conductive circuit and the second conductive circuit; at least a first interlayer insulation layer formed on the first surface of the core substrate; and at least a second interlayer insulation layer formed on the second surface of the core substrate. Such a printed wiring board is technologically featured as follows: When the thermal expansion coefficient of the core substrate is set at $\alpha$ (1/K), Young's modulus of the core substrate at E (GPa), the thickness of the core substrate at a (mm), the sum of the thickness of each first interlayer insulation layer at b (mm), and the sum of the thickness of each second interlayer insulation layer at c (mm), such $\alpha$, E, a, b and c satisfy the following relation: $\alpha/(E\times(a+b+c))=0.5\times10^{-6} \sim 2.5\times10^{-6}/\text{GPa·mm·K}$

Effect(s) of the Invention

Inorganic particles are added to a core substrate to reduce its thermal expansion coefficient, while thicknesses of the core substrate and at least one first interlayer insulation layer and at least one second interlayer insulation layer are adjusted, so that the following is satisfied: $\alpha/(E\times(a+b+c))=0.5\times10^{-6} \sim 2.5\times10^{-6}/\text{GPa·mm·K}$. Accordingly, by using a thin core substrate with a low thermal expansion coefficient and interlayer insulation layers without core material such as glass fiber, it is expected that warping will not occur in the printed wiring board. Here, a through-hole conductor of the core substrate is formed with a first conductive circuit on a first surface, a second conductive circuit on a second surface, and plating filled in a penetrating hole, connecting the first conductive circuit and the second conductive circuit. Therefore, heat dissipation is enhanced by the through-hole conductor, and it is thought that warping is suppressed from occurring in the printed wiring board. By laminating interlayer insulation layers without core material such as glass fiber on a thin core substrate, it is thought that fine-pattern wiring is formed, the printed wiring board is made thinner and heat dissipation is improved.

BRIEF DESCRIPTION OF THE DRAWINGS

FIG. 3 views of steps for manufacturing a printed wiring board in example 1;
FIG. 4 views of steps for manufacturing a printed wiring board in example 1;
FIG. 5 views of steps for manufacturing a printed wiring board in example 1.

FIG. 10(A) is a schematic view to illustrate the amount of warping, and FIG. 10(B) is a schematic view to illustrate the gravity center;

FIG. 11 a table showing results of the amounts of warping tested in examples 2; and FIG. 12 a table showing structures of glass cloth used for core substrates in examples 2.

MODE TO CARRY OUT THE INVENTION

Example 1

Figure 1:
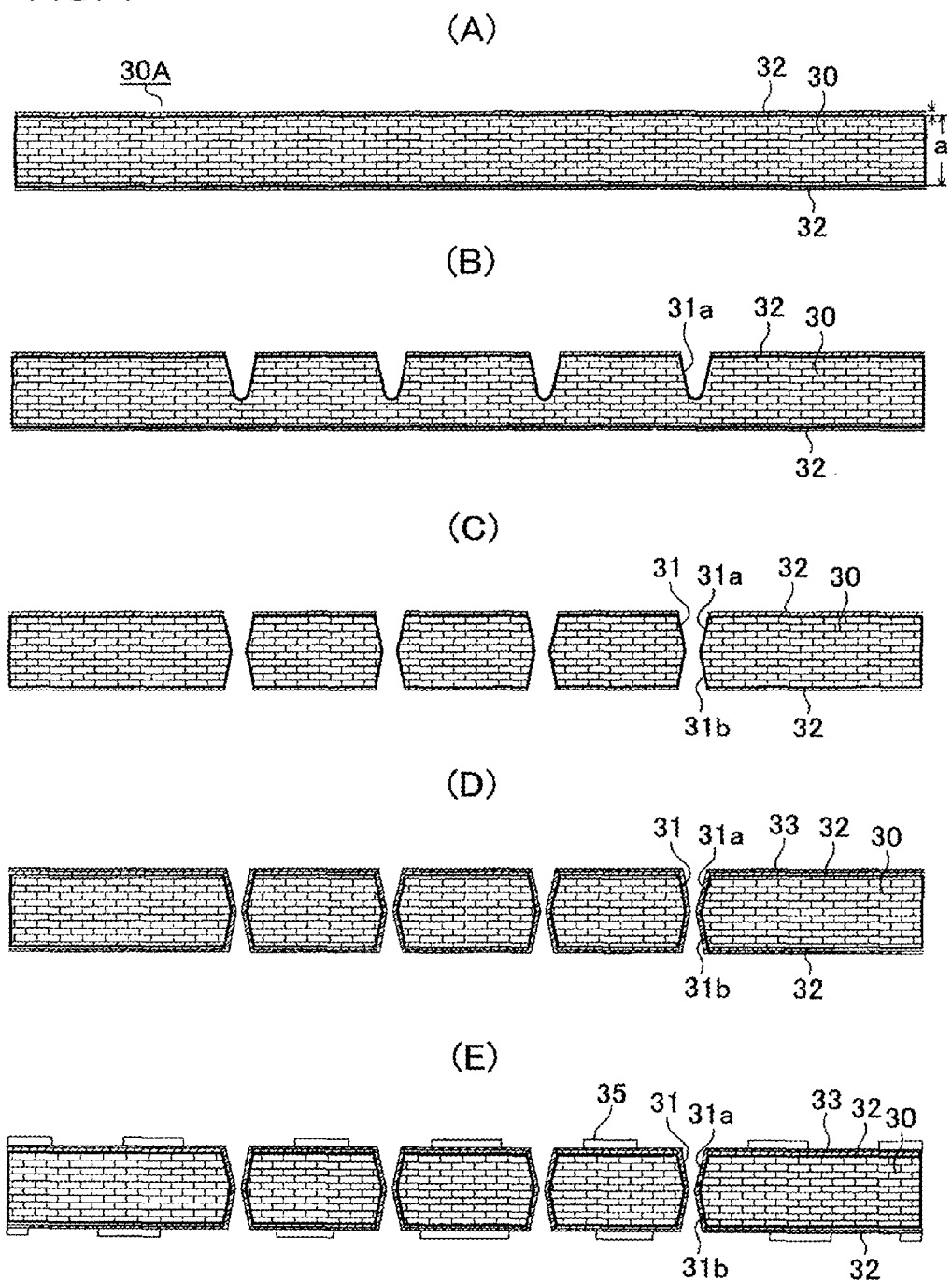
FIG. 1 views of steps for manufacturing a printed wiring board according to example 1 of the present invention.
Figure 2:
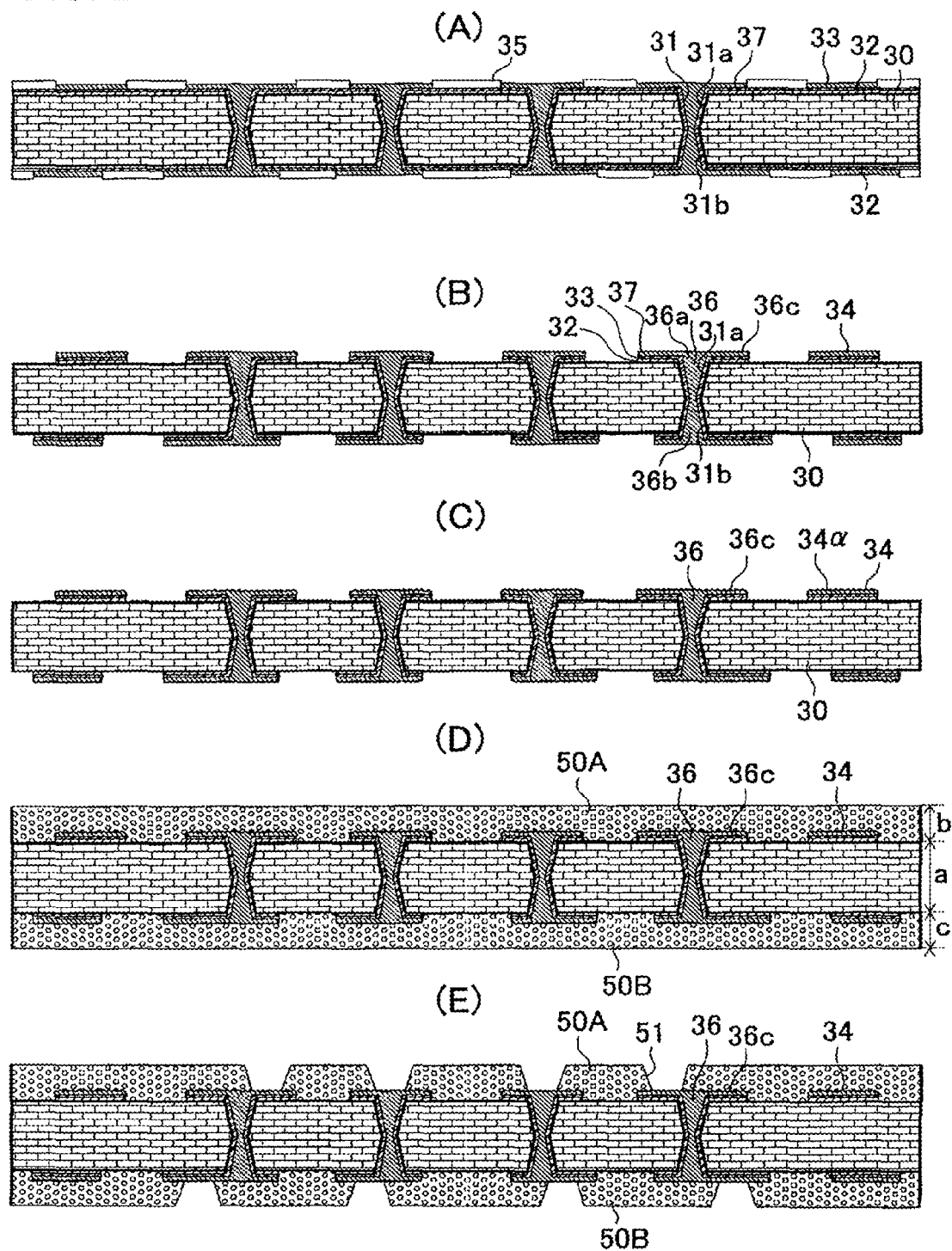
FIG. 2 views of steps for manufacturing a printed wiring board in example 1.
Figure 6:
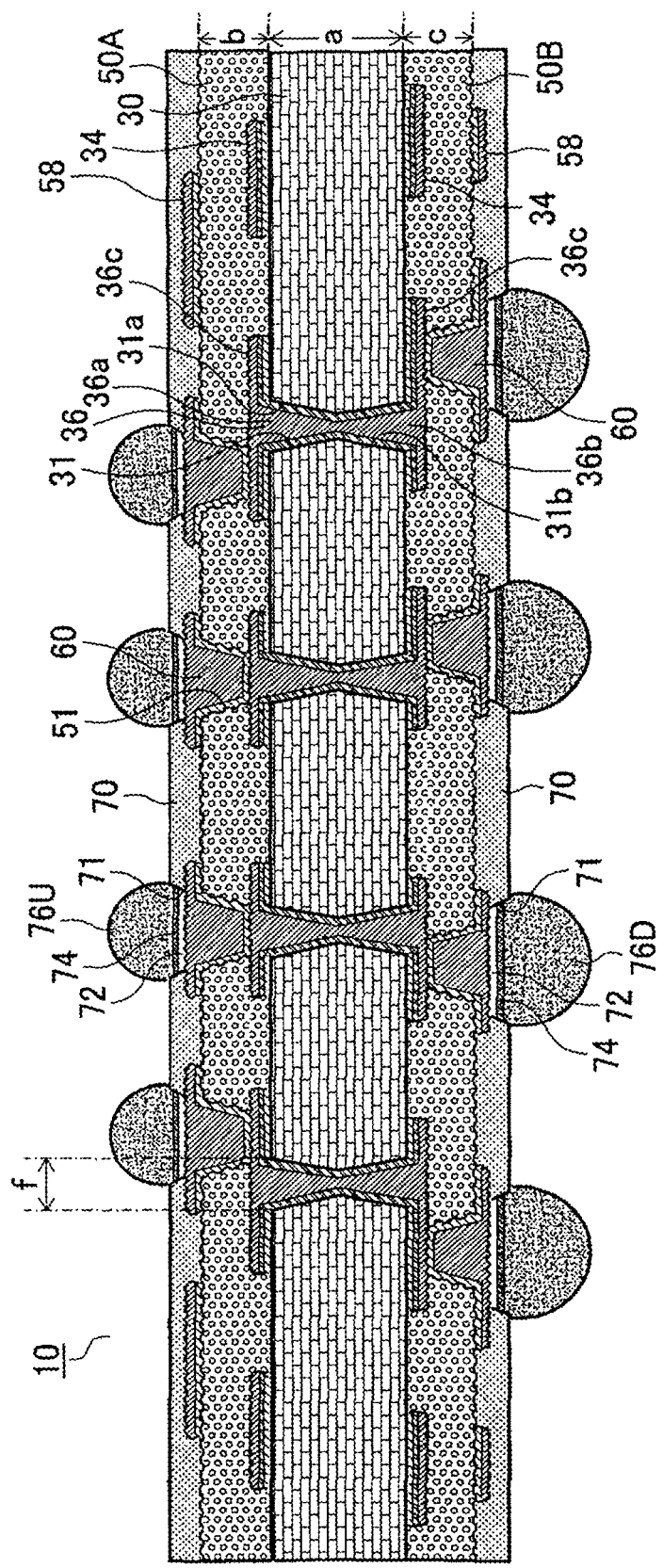
FIG. 6 a cross-sectional view of a printed wiring board according to example 1.
Figure 7:
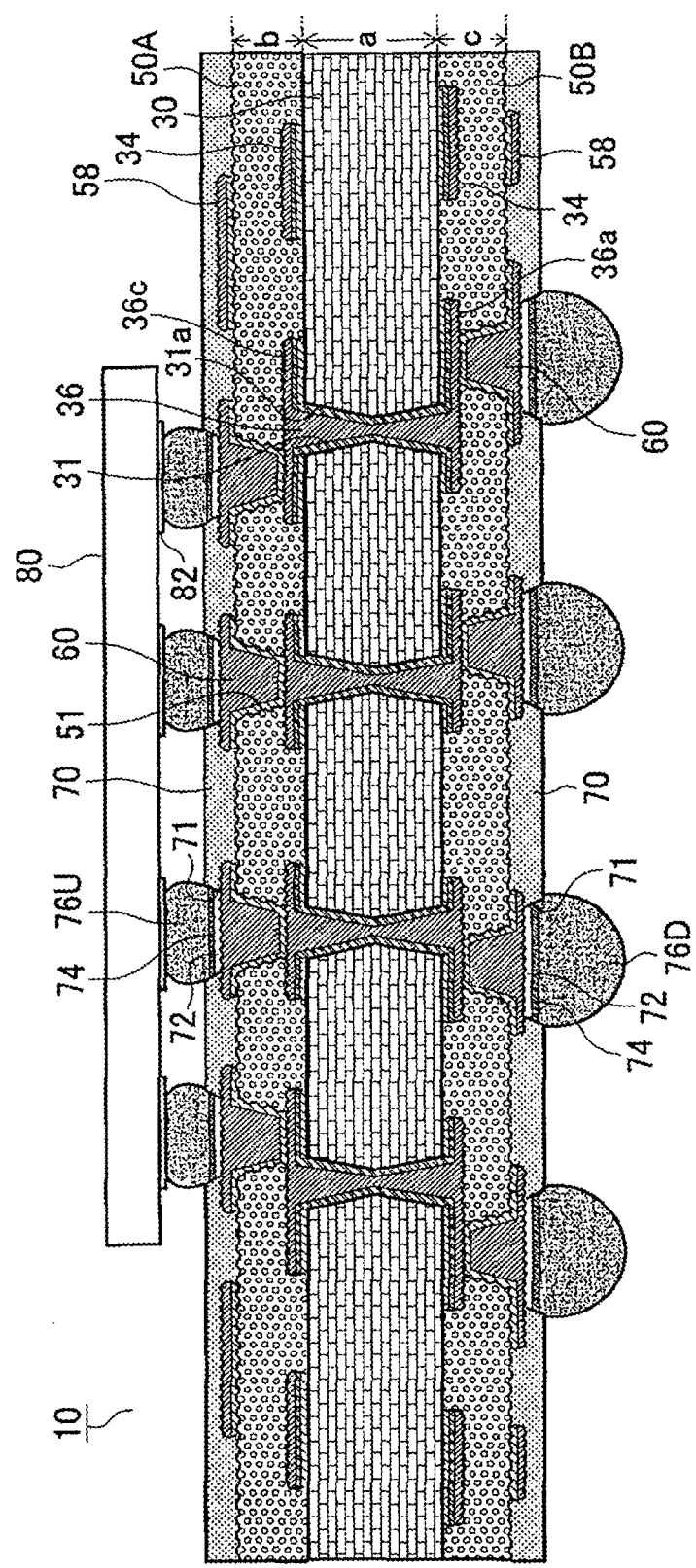
FIG. 7 a cross-sectional view of a printed wiring board according to example 1 where an IC chip is mounted.

Next, the structure of printed wiring board 10 according to example 1 of the present invention is described with reference to FIGS. 1~7. FIG. 6 shows a cross-sectional view of printed wiring board 10, and FIG. 7 shows a state in which IC chip 80 is mounted on printed wiring board 10 shown in FIG. 6. As shown in FIG. 6, conductive circuits 34 are formed on surfaces of core substrate 30 in printed wiring board 10. Upper and lower surfaces of core substrate 30 are connected by through-hole conductor 36. Through-hole conductor 36 is made up of first conductive portion (36a) tapering from the upper-surface (first-surface) side toward the lower surface (second surface), and of second conductive portion (36b) tapering from the lower-surface (second-surface) side toward the first surface. On the upper surface (first surface) of core substrate 30, first interlayer insulation layer (50A) is formed, where via hole 60 and conductive circuit 58 are formed. On the lower surface (second surface), second interlayer insulation layer (50B) is formed, where via hole 60 and conductive circuit 58 are formed. Solder-resist layer 70 is formed on via hole 60 and conductive circuit 58. Solder bump (76U) is formed in opening 71 of solder-resist layer 70 on the upper-surface (first-surface) side. Solder bump (76D) is formed in an opening of solder-resist layer 70 on the lower-surface (second-surface) side. Pad 82 of IC chip 80 is connected to solder bump (76D) on the upper-surface side as shown in FIG. 7.

In example 1, to lower thermal expansion coefficient ($\alpha$) to $5 \times 10^{-6}$ (1/K)~$8 \times 10^{-6}$ (1/K), inorganic particles made of silica or alumina are added at 20 wt. %~40 wt. % to core substrate 30 formed by impregnating core material of glass cloth with epoxy resin. Then, Young's modulus (E) of core substrate 30 is set at 22 GPa. Also, its glass transition temperature is made higher than existing substrates. Here, thickness (a) of core substrate 30 is adjusted to 0.15 mm. Thickness (b) of upper-surface-side first interlayer insulation layer (50A) is set at 0.02 mm, and thickness (c) of lower-surface-side second interlayer insulation layer (50B) is also set at 0.02 mm.

Accordingly, printed wiring board 10 in example 1 satisfies the following:

$$\alpha/(E \times (a+b+c)) = 0.9 \times 10^{-6} \sim 1.7 \times 10^{-6} / \text{GPa} \cdot \text{mm} \cdot \text{K}$$

When thin core substrate 30 is used along with first interlayer insulation layer (50A) and second interlayer insulation layer (50B) without core material, warping does not occur in the printed wiring board by satisfying the above relation. Here, since through-hole conductor 36 of core substrate 30 is made up of first conductive portion (36a) tapering from the upper-surface (first-surface) side toward the lower surface (second surface), and of second conductive portion (36b) tapering from the lower-surface (second-surface) side toward the first surface, it is thought that warping in core substrate 30 is suppressed by through-hole conductor 36. When thin interlayer insulation layers without core material are laminated on a thin core substrate, it is thought that a printed wiring board is made thinner and its heat dissipation is enhanced.

When the thickness of a core substrate and the thicknesses of interlayer insulation layers are totaled to be in the range of 0.08 mm~0.60 mm, the thickness of the core substrate is preferred to be 0.06 mm~0.40 mm. Moreover, thicknesses of a first interlayer insulation layer and a second interlayer insulation layer are each preferred to be 0.01 mm~0.10 mm. If the thickness of a core substrate is less than 0.06 mm, it is thought that warping of the printed wiring board cannot be prevented even if the thermal expansion coefficient and Young's modulus of the core substrate are adjusted. On the other hand, if the thickness of a core substrate exceeds 0.40 mm, it is thought that insulation cannot be secured since the first interlayer insulation layer and the second interlayer insulation layer are each too thin.

Maximum outer diameter (d) of a through-hole conductor (the diameter at a surface part of the core substrate) is preferred to be 70~150 µm. If it is smaller than 70 µm, when diameters of the first conductive portion and the second conductive portion of the through-hole conductor decrease toward the center, the first conductive portion and the second conductive portion may not be aligned well. If it exceeds 150 µm, the wiring density of through holes is lowered and it is thought that a fine pitch cannot be achieved. Here, through-hole conductors are preferred to be formed so as to occupy 1%~5% of the core substrate. At less than 1%, the wiring density of through holes is lowered and it is thought that a fine pitch may not be achieved. If exceeding 5%, the rigidity of the core substrate is reduced, and warping is thought to be difficult to prevent.

Regarding printed wiring board 10 described above with reference to FIG. 6, its manufacturing method is described as follows by referring to FIGS. 1~6.

(1) Insulative substrate 30 with a thickness of 0.15 mm is prepared as follows: Core material such as glass cloth is impregnated with glass epoxy resin or BT (bismaleimide triazine) resin; then, inorganic particles made of silica or alumina with an average particle diameter of 0.3 µm are added to the resin at 20~40 wt. % so that the thermal expansion coefficient (CTE) is lowered to $5 \times 10^{-6}$ (1/K)~$8 \times 10^{-6}$ (1/K). Copper-clad laminate (30A) is the starting material, formed by laminating 3~5 µm-thick copper foil 32 on both surfaces of insulative substrate 30 (FIG. 1(A)). First, from the upper-surface (first-surface) side, a laser is irradiated at a location for forming a through hole to form first opening (31a), which tapers with a diameter decreasing from the first-surface side toward the second surface (FIG. 1(B)). Then, from the lower-surface (second-surface) side, a laser is irradiated at the location for forming a through hole to form second opening (31b), which tapers with a diameter decreasing from the second-surface side toward the first surface. Accordingly, through-hole penetrating hole 31 made of first opening (31a) and second opening (31b) is formed (FIG. 1(C)). Tapering includes first opening (31a) and second opening (31b) becoming gradually narrower toward the center of the core substrate.

In example 1, since the thickness of insulative substrate 30 is thin at 0.15 mm, it is possible to form an opening by irradiating a laser once without irradiating twice at the upper surface and the lower surface. However, by reducing the laser intensity and irradiating the laser twice, an opening is formed to be made up of tapered first opening (31a) with a diameter decreasing toward the second surface and tapered second opening (31b) with a diameter decreasing toward the first surface. In a step described later, a through-hole conductor is formed with first conductive portion (36a) and second conductive portion (36b), whose diameters decrease as they go toward the center.

(2) A palladium catalyst (made by Atotech) is applied to surfaces of substrate 30, and electroless copper plating is performed. Accordingly, 0.6 μm-thick electroless copper-plated film 33 is formed on substrate surfaces and side walls of through-hole penetrating hole 31 (FIG. 1(D)).

(3) A commercially available photosensitive film is laminated, exposed to light and developed with a mask placed thereon to form plating resist 35 with a predetermined pattern where electroless plated film 33 is exposed in portions to form conductive circuits and through-hole conductors (FIG. 1(E)).

(4) Electrolytic plating is performed under the following conditions to form electrolytic copper plating 37 in through-hole penetrating hole 31 and portions of substrate 30 where plating resist 35 is not formed (FIG. 2(A)).

[Electrolytic Plating Solution]

| | |
|---|---|
| sulfuric acid | 180 g/L |
| copper sulfate | 80 g/L |
| additive (brand name: Cupracid GL, made by Atotech Japan) | 1 ml/L |

[Electrolytic Plating Conditions]

| | |
|---|---|
| current density | 1 A/dm$^2$ |
| time | 70 minutes |
| temperature | room temperature |

(6) Next, plating resist 35 is removed using 5% KOH, and electroless plated film 33 and copper foil 32 are dissolved and removed from portions where plating resist was formed using an etching solution mainly containing copper (II) chloride to form conductive circuits 34 including through-hole lands (36c) (FIG. 2(B)).

(7) Surfaces of conductive circuits 34 and through-hole lands (36c) are roughened by an etching solution to form roughened layers (concavo-convex layers) (34a) (FIG. 2(C)).

(8) On the upper surface (first surface) and lower surface (second surface) of substrate 30, resin film for interlayer insulation layers (brand name: ABF-45SH, made by Ajinomoto), which does not contain core material and has a size slightly smaller than that of the substrate, is placed on the substrate and preliminarily pressed under the conditions of pressure at 0.45 MPa, temperature at 80° C. and pressing time of 10 seconds, and then cut to size. Moreover, by laminating using a vacuum laminator and by the following method, first interlayer insulation layer (50A) and second interlayer insulation layer (50B) are formed (FIG. 2(D)). Namely, resin film for interlayer insulation layers is placed on the substrate to perform final pressing under the conditions of vacuum degree at 67 Pa, pressure at 0.47 MPa, temperature at 85° C. and pressing time of 60 seconds. Then, the film was thermally cured at 170° C. for 40 minutes. As described above with reference to FIG. 6, thickness (a) of core substrate 30 is set at 0.15 mm, thickness (b) of upper-surface-side first interlayer insulation layer (50A) at 0.02 mm, and thickness (c) of lower-surface-side second interlayer insulation layer (50B) at 0.02 mm.

(9) Next, using a CO2 gas laser with a wavelength of 10.4 μm, via-hole openings 51 are formed in interlayer insulation layers (50A, 50B) under the conditions of beam diameter of 4.0 mm, top-hat mode, pulse width at 3~30 μsec., diameter of penetrating holes of a mask at 1.0~5.0 mm, and 1-3 shots (FIG. 2(E)).

(10) The substrate with via-hole openings 51 is immersed for 10 minutes in an 80° C. solution containing 60 g/L permanganic acid to remove particles existing on surfaces of interlayer insulation layers (50A, 50B). Accordingly, surfaces of interlayer insulation layers (50A, 50B) including inner walls of via-hole openings 51 are roughened to form roughened surfaces (50α) (FIG. 3(A)).

(11) Next, the substrate after the above treatment is immersed in a neutralizer (made by Shipley Company) and washed with water. Then, a palladium catalyst is applied to surfaces of the substrate after the roughening treatment (roughened depth 3 μm) so that catalytic nuclei are attached to surfaces of interlayer insulation layers and inner walls of via-hole openings. Namely, the above substrate is immersed in a catalyst solution containing palladium chloride (PbCl2) and stannous chloride (SnCl2) to deposit palladium metal, and the catalyst is attached.

(12) Next, the substrate with the catalyst is immersed in an electroless copper plating solution (Thru-Cup PEA) made by C. Uyemura & Co., Ltd. to form electroless copper-plated film with a thickness of 0.3~3.0 μm on the entire roughened surface. Accordingly, a substrate is obtained having electroless copper-plated film 52 formed on surfaces of first interlayer insulation layer (50A) and second interlayer insulation layer (50B) including inner walls of via-hole openings 51 (FIG. 3(B)).

(13) Commercially available photosensitive dry film is laminated on the substrate where electroless copper-plated film 52 is formed, a mask is placed thereon, exposed to light at 110 mJ/cm2, and developed using a 0.8% sodium carbonate solution to form 25 μm-thick plating resist 54 (FIG. 3(C)).

(14) After the substrate is washed with 50° C. water to degrease, washed with 25° C. water, and further cleansed with sulfuric acid, electrolytic plating is performed under the following conditions to form electrolytic copper-plated film 56 with a thickness of 15 μm where plating resist 54 is not formed (FIG. 4(A)).

[Electrolytic Plating Solution]

| | |
|---|---|
| sulfuric acid | 2.24 mol/L |
| copper sulfate | 0.26 mol/L |
| additive | 19.5 ml/L |
| (brand name: Cupracid GL, made by Atotech Japan) | |

[Electrolytic Plating Conditions]

| | |
|---|---|
| current density | 1 A/dm2 |
| time | 70 minutes |
| temperature | 22 ± 2° C. |

(15) In addition, after plating resist 54 is removed using 5% KOH, electroless plated film under the plating resist is dissolved and removed by etching using a mixed solution of sulfuric acid and hydrogen peroxide to form conductive circuits 58 and via holes 60 (FIG. 4(B)).

(16) Then, the same treatment as in above (4) is conducted so that surfaces of conductive circuits 58 and via holes 60 are roughened to form roughened surfaces (58α) (FIG. 4(C)).

(17) Next, commercially available solder-resist composition 70 is applied on both surfaces of the multilayer wiring substrate to be 20 μm thick, which is then dried, exposed to ultraviolet light while a 5 mm-thick photomask with a pattern of solder-resist opening portions is adhered to solder-resist layer 70, and developed using a DMTG solution. Accordingly, smaller-diameter opening 71 is formed on the upper-surface side, and larger-diameter opening 71 is formed on the lower-surface side (FIG. 5(A)). Furthermore, solder-resist layers are cured by thermal treatment to form solder-resist pattern layers having openings with a thickness of 15~25 μm. (18) Next, the substrate with solder-resist layers 70 is immersed in an electroless nickel plating solution to form 5 μm-thick nickel-plated layer 72 in opening portions 71. Furthermore, the substrate is immersed in an electroless gold plating solution to form 0.03 μm-thick gold-plated layer 74 on nickel-plated layer 72 (FIG. 5(B)). Instead of nickel-gold layers, nickel-palladium-gold layers or a single-layer noble metal layer (such as gold, silver, palladium or platinum) may also be formed.

(19) After flux 78 is applied in openings 71, smaller-diameter solder ball (77U) is loaded in opening 71 of upper-surface-side solder-resist layer 70, and larger-diameter solder ball (77D) is loaded in opening 71 of lower-surface-side solder-resist layer 70 (FIG. 5(C)). Then, a reflow is conducted to form solder bump (76U) on the upper surface and solder bump (76D) on the lower-surface side (FIG. 6).

(20) IC chip 80 is mounted on printed wiring board 10 and a reflow is conducted to connect a connection pad of the printed wiring board to electrode 82 of IC chip 80 via solder bump (76U) (FIG. 7).

Figure 8:
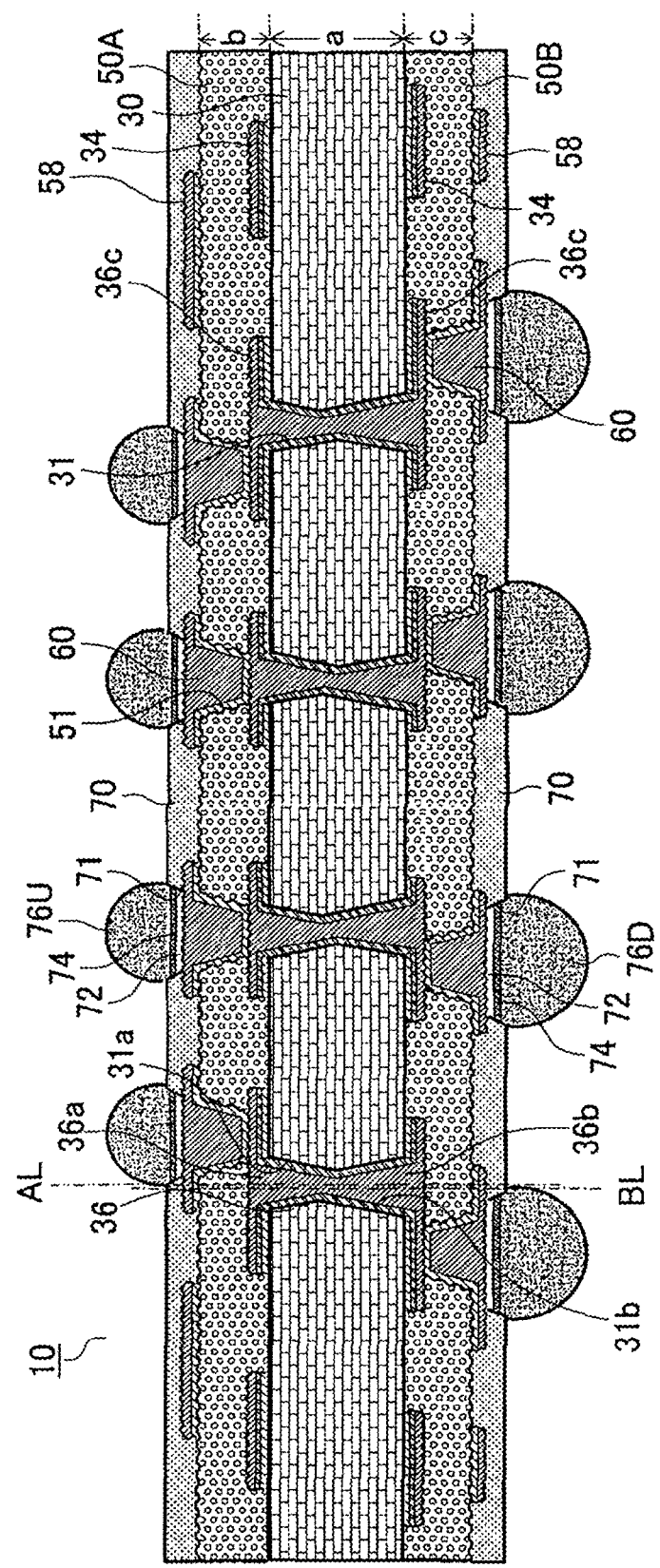
FIG. 8 a cross-sectional view of an alternative example of example 1.
Figure 9:
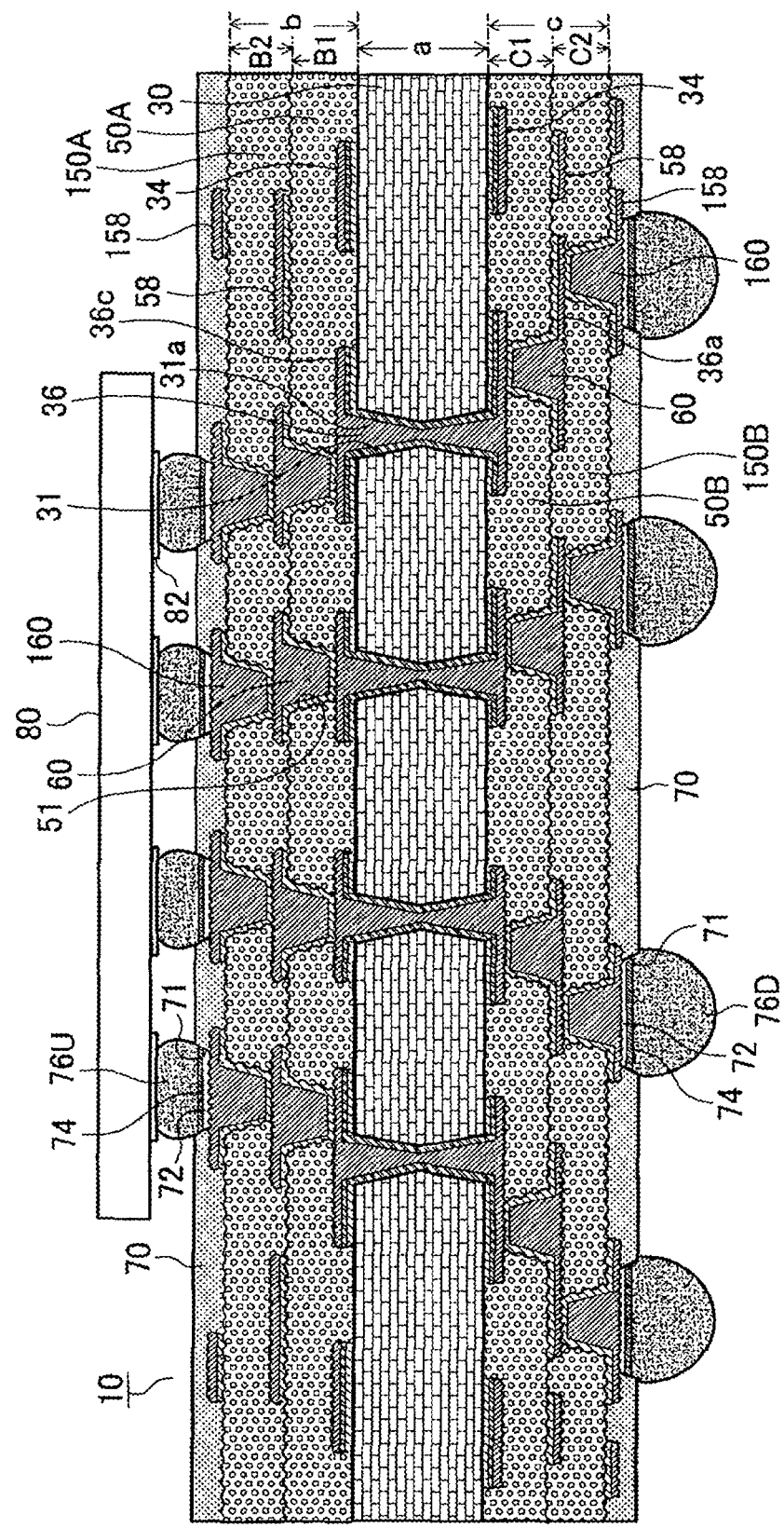
FIG. 9 a cross-sectional view of a printed wiring board according to example 3.

FIG. 8 shows an alternative example of example 1. In the alternative example, straight line (AL), which passes through the gravity center of first opening (31a) of first conductive portion (36a) of through-hole conductor 36 and is perpendicular to the first surface of the core substrate, is offset from straight line (BL), which passes through the gravity center of second opening (31b) of second conductive portion (36b) and is perpendicular to the first surface of the core substrate. Here, as shown in FIG. 10(B), the gravity center means a point where the major axis (portion of the longest diameter) intersects the minor axis (portion of the shortest diameter) on a circular opening.

Examples 2

In examples 2, the substrates are formed the same as in example 1, but the following were modified: thickness (a) of the core substrate, thickness (b) of the first interlayer insulation layer, thickness (c) of the second interlayer insulation layer, thermal expansion coefficient (CTE) of the core substrate, and Young's modulus (E) of the core substrate. FIG. 11 shows measurement results of the amounts of warping. However, the first interlayer insulation layer and the second interlayer insulation layer may each be single-layered or multilayered. The size of a printed wiring board is 12 mm×12 mm. As shown in FIG. 10(A), the amount of warping is the distance from the outer end of a printed wiring board to the most warped point in a vertical direction of the printed wiring board, measured at temperatures of 25° C. and 260° C. Here, if the amount of warping exceeds ±100 μm ("+" means the amount of upward warping in a concave shape, and "−" means the amount of downward warping in a concave shape), the mounting accuracy of an IC chip declines. Thus, the amount of warping is required to be 100 μm or less. The amounts of warping are values computed in simulations.

Example 2-1

The thermal expansion coefficient (CTE) of a core substrate was set at 8.61, Young's modulus (E) of the core substrate at 19.1 (Gpa), thickness (a) of the core substrate at 0.15 (mm), thickness (b) of a first interlayer insulation layer at 0.03 (mm), and thickness (c) of a second interlayer insulation layer at 0.03 (mm). The core substrate is formed using BT (bismaleimide triazine) imide resin, glass cloth made of S-glass with a thermal expansion coefficient of 2.4 (1/K) (see FIG. 12), and an SiO2 filler content of 30%. In example 2-1, CTE/(E×(a+b+c))=2.15×10$^{-6}$/GPa·mm·K, and the amount of warping was 81 μm, which is within the value of 100 μm or less.

Example 2-2

The thermal expansion coefficient (CTE) of a core substrate was set at 6.18 (1/K), Young's modulus (E) of the core substrate at 26 (Gpa), thickness (a) of the core substrate at 0.1 (mm), thickness (b) of a first interlayer insulation layer at 0.04 (mm), and thickness (c) of a second interlayer insulation layer at 0.04 (mm). The core substrate is formed using denatured epoxy (epoxy resin with low thermal expansion), glass cloth made of S-glass with a thermal expansion coefficient of 2.4 (1/K) (see FIG. 12), and an SiO2 filler content of 30%. In example 2-2, CTE/(E×(a+b+c))=1.32×10$^{-6}$/GPa·mm·K, and the amount of warping was 79 μm.

Example 2-3

The thermal expansion coefficient (CTE) of a core substrate was set at 6.18 (1/K), Young's modulus (E) of the core substrate at 26 (Gpa), thickness (a) of the core substrate at 0.15 (mm), thickness (b) of a first interlayer insulation layer at 0.03 (mm), and thickness (c) of a second interlayer insulation layer at 0.03 (mm). The core substrate is formed using denatured epoxy (epoxy resin with low thermal expansion), glass cloth made of S-glass with a thermal expansion coefficient of 2.4 (1/K) (see FIG. 12), and an SiO2 filler content of 30%. In example 2-3, CTE/(E×(a+b+c))=1.13×10$^{-6}$/GPa·mm·K, and the amount of warping was 70 μm.

Example 2-4

The thermal expansion coefficient (CTE) of a core substrate was set at 6.18 (1/K), Young's modulus (E) of the core substrate at 26 (Gpa), thickness (a) of the core substrate at 0.2 (mm), thickness (b) of a first interlayer insulation layer at 0.04 (mm), and thickness (c) of a second interlayer insulation layer at 0.04 (mm). The core substrate is formed using denatured epoxy (epoxy resin with low thermal expansion), glass cloth made of S-glass with a thermal expansion coefficient of 2.4 (1/K) (see FIG. 12), and an SiO2 filler content of 30%. In example 2-4, CTE/(E×(a+b+c))=0.85×10$^{-6}$/GPa·mm·K, and the amount of warping was 64 μm.

Example 2-5

The thermal expansion coefficient (CTE) of a core substrate was set at 6.18 (1/K), Young's modulus (E) of the core substrate at 26 (Gpa), thickness (a) of the core substrate at 0.25 (mm), thickness (b) of a first interlayer insulation layer at 0.03 (mm), and thickness (c) of a second interlayer insulation layer at 0.03 (mm). The core substrate is formed using denatured epoxy (epoxy resin with low thermal expansion), glass cloth made of S-glass with a thermal expansion coefficient of 2.4 (1/K) (see FIG. 12), and an SiO2 filler content of 30%. In example 2-5, CTE/(E×(a+b+c))=0.77×10$^{-6}$/GPa·mm·K, and the amount of warping was 61 μm.

Example 2-6

The thermal expansion coefficient (CTE) of a core substrate was set at 6.18 (1/K), Young's modulus (E) of the core substrate at 26 (Gpa), thickness (a) of the core substrate at 0.3 (mm), thickness (b) of a first interlayer insulation layer at 0.025 (mm), and thickness (c) of a second interlayer insulation layer at 0.025 (mm). The core substrate is formed using denatured epoxy (epoxy resin with low thermal expansion), glass cloth made of S-glass with a thermal expansion coefficient of 2.4 (1/K) (see FIG. 12), and an SiO2 filler content of 30%. In example 2-6, CTE/(E×(a+b+c))=0.68×10$^{-6}$/ GPa·mm·K, and the amount of warping was 55 μm.

Example 2-7

The thermal expansion coefficient (CTE) of a core substrate was set at 6.18 (1/K), Young's modulus (E) of the core substrate at 26 (Gpa), thickness (a) of the core substrate at 0.25 (mm), thickness (b) of a first interlayer insulation layer at 0.04 (mm), and thickness (c) of a second interlayer insulation layer at 0.04 (mm). The core substrate is formed using denatured epoxy (epoxy resin with low thermal expansion), glass cloth made of S-glass with a thermal expansion coefficient of 2.4 (1/K) (see FIG. 12), and an SiO2 filler content of 30%. In example 2-7, CTE/(E×(a+b+c))=0.72×10$^{-6}$/GPa·mm·K, and the amount of warping was 56 μm.

Example 2-8

The thermal expansion coefficient (CTE) of a core substrate was set at 8.61 (1/K), Young's modulus (E) of the core substrate at 19.1 (Gpa), thickness (a) of the core substrate at 0.15 (mm), thickness (b) of a first interlayer insulation layer at 0.04 (mm), and thickness (c) of a second interlayer insulation layer at 0.04 (mm). The core substrate is formed using BT (bismaleimide triazine) imide resin, glass cloth made of S-glass with a thermal expansion coefficient of 2.4 (1/K) (see FIG. 12), and an SiO2 filler content of 30%. In example 2-8, CTE/(E×(a+b+c))=1.96×10$^{-6}$/GPa·mm·K, and the amount of warping was 82 μm.

Example 2-9

The thermal expansion coefficient (CTE) of a core substrate was set at 8.61 (1/K), Young's modulus (E) of the core substrate at 19.1 (Gpa), thickness (a) of the core substrate at 0.2 (mm), thickness (b) of a first interlayer insulation layer at 0.04 (mm), and thickness (c) of a second interlayer insulation layer at 0.04 (mm). The core substrate is formed using BT (bismaleimide triazine) imide resin, glass cloth made of S-glass with a thermal expansion coefficient of 2.4 (1/K) (see FIG. 12), and an SiO2 filler content of 30%. In example 2-9, CTE/(E×(a+b+c))=1.61×10$^{-6}$/GPa·mm·K, and the amount of warping was 76 μm.

Example 2-10

The thermal expansion coefficient (CTE) of a core substrate was set at 8.61 (1/K), Young's modulus (E) of the core substrate at 19.1 (Gpa), thickness (a) of the core substrate at 0.1 (mm), thickness (b) of a first interlayer insulation layer at 0.04 (mm), and thickness (c) of a second interlayer insulation layer at 0.04 (mm). The core substrate is formed using BT (bismaleimide triazine) imide resin, glass cloth made of S-glass with a thermal expansion coefficient of 2.4 (1/K) (see FIG. 12), and an SiO2 filler content of 30%. In example 2-10, CTE/(E×(a+b+c))=2.50×10$^{-6}$/GPa·mm·K, and the amount of warping was 85 μm.

Comparative Example 1

The thermal expansion coefficient (CTE) of a core substrate was set at 12.21 (1/K), Young's modulus (E) of the core substrate at 9.6 (Gpa), thickness (a) of the core substrate at 0.1 (mm), thickness (b) of a first interlayer insulation layer at 0.04 (mm), and thickness (c) of a second interlayer insulation layer at 0.04 (mm). The core substrate is formed using denatured epoxy (epoxy resin with low thermal expansion), glass cloth made of E-glass with a thermal expansion coefficient of 4.5 (1/K) (see FIG. 12), and an SiO2 and Al2O3 filler content of 25%. In comparative example 1, CTE/(E×(a+b+c))=7.07× 10$^{-6}$/GPa·mm·K, and the amount of warping was 100 μM.

Comparative Example 2

The thermal expansion coefficient (CTE) of a core substrate was set at 12.35 (1/K), Young's modulus (E) of the core substrate at 13.2 (Gpa), thickness (a) of the core substrate at 0.1 (mm), thickness (b) of a first interlayer insulation layer at 0.04 (mm), and thickness (c) of a second interlayer insulation layer at 0.04 (mm). The core substrate is formed using BT (bismaleimide triazine) imide resin, glass cloth made of E-glass with a thermal expansion coefficient of 4.5 (1/K) (see FIG. 12), and an SiO2 filler content of 25%. In comparative example 1, CTE/(E×(a+b+c))=5.20×10$^{-6}$/GPa·mm·K, and the amount of warping was 136 μm, which exceeds 100 μM.

Comparative Example 3

The thermal expansion coefficient (CTE) of a core substrate was set at 8.61 (1/K), Young's modulus (E) of the core substrate at 19.1 (Gpa), thickness (a) of the core substrate at 0.05 (mm), thickness (b) of a first interlayer insulation layer at 0.06 (mm), and thickness (c) of a second interlayer insulation layer at 0.06 (mm). The core substrate is formed using BT (bismaleimide triazine) imide resin, glass cloth made of S-glass with a thermal expansion coefficient of 2.4 (1/K) (see FIG. 12), and an SiO2 filler content of 30%. In comparative example 3, CTE/(E×(a+b+c))=2.65×10$^{-6}$/GPa·mm·K, and the amount of warping was 145 μm, which exceeds 100 μm.

Reference Example 1

The thermal expansion coefficient (CTE) of a core substrate was set at 6.18 (1/K), Young's modulus (E) of the core substrate at 26 (Gpa), thickness (a) of the core substrate at 0.5 (mm), thickness (b) of a first interlayer insulation layer at 0.04 (mm), and thickness (c) of a second interlayer insulation layer at 0.04 (mm). The core substrate is formed using denatured epoxy (epoxy resin with low thermal expansion), glass cloth made of S-glass with a thermal expansion coefficient of 2.4 (1/K) (see FIG. 12), and an SiO2 filler content of 30%. In reference example 1, CTE/(E×(a+b+c))=0.41×10$^{-6}$/ GPa·mm·K, and the amount of warping was 51 μm.

As shown in examples 2-1 through 2-10, the thermal expansion coefficient of a core substrate is lowered while thicknesses of the core substrate, a first interlayer insulation layer and a second interlayer insulation layer are adjusted so that CTE/(E×(a+b+c))=0.5×10$^{-6}$~2.5×10$^{-6}$/GPa·mm·K is satisfied. In doing so, it is thought that warping of 100 μm or greater does not occur in the printed wiring board. Here, if the thickness of the core substrate is set less than 0.06 mm, even if CTE/(E×(a+b+c))=0.5×10$^{-6}$~2.5×10$^{-6}$/GPa·mm·K is satisfied, it is thought that the amount of warping is not suppressed to be ±100 μm or less. Also, as shown in reference example 1, if it is less than CTE/(E×(a+b+c))=0.5×10$^{-6}$/ GPa·mm·K, the amount of warping is suppressed to be 100 μm or less, but the thickness of the core substrate is required to be set at 0.4 mm or greater. Thus, it is thought that the objective of the present invention to reduce the entire thickness is not achieved.

Example 3

In example 1, one each layer of first interlayer insulation layer (50A) and second interlayer insulation layer (50B) were formed on core substrate 30. By contrast, in example 3, two layers of first interlayer insulation layers (50A, 150A) are formed on the first-surface (upper-surface) side, and two layers of second interlayer insulation layers (50B, 150B) are formed on the second-surface (lower-surface) side. In interlayer insulation layers (150A, 150B), via holes 160 and conductive circuits 158 are formed. When two or more layers of interlayer insulation layers are formed as in example 3, if (b) on the first-surface (upper-surface) side, which is the sum of thickness (B1) of lower first interlayer insulation layer (50A) and thickness (B2) of upper first interlayer insulation layer (150A), and (c) on the second-surface (lower-surface) side, which is the sum of thickness (C1) of lower second interlayer insulation layer (50B) and thickness (C2) of upper second interlayer insulation layer (150B), satisfy the following relation the same as in example 1, it is thought warping is suppressed from occurring.

$$\alpha/(E\times(a+b+c))=0.5\times10^{-6}\sim2.5\times10^{-6}/\text{GPa·mm·K}$$

In examples 2-1 through 2-10, the number of first interlayer resin insulation layers and second interlayer resin insulation layers may each be one, the same as in example 1, or may each be multiple with two or more layers, the same as in example 3.

DESCRIPTION OF NUMERICAL REFERENCES

10 printed wiring board
30 insulative substrate
31 penetrating hole for via hole
31a first opening
31b second opening
34 conductive circuit
36 via-hole conductor
36a first conductive portion
36b second conductive portion
36c via-hole land
50A first interlayer insulation layer
50B second interlayer insulation layer
58 conductive circuit
60 via hole
70 solder-resist layer

The invention claimed is:

1. A printed wiring board, comprising:
   a core substrate formed of a single layer having a thickness in a range of from about 0.06 mm to about 0.40 mm and a thermal expansion coefficient $\alpha$ in a range of from $5\times10^{-6}$ to $8\times10^{-6}$;
   a first conductive circuit formed directly on a first surface of the core substrate;
   a second conductive circuit formed directly on a second surface of the core substrate on an opposite side with respect to the first surface;
   a through-hole conductor formed in a penetrating hole extending from the first surface to the second surface of the core substrate and connecting the first conductive circuit and the second conductive circuit;
   at least one first interlayer insulation layer formed on the first surface of the core substrate; and
   at least one second interlayer insulation layer formed on the second surface of the core substrate,
   wherein the core substrate, the first interlayer insulation layer and the second interlayer insulation layer satisfy an equation, $\alpha/(E\times(a+b+c))=0.5\times10^{-6}\sim2.5\times10^{-6}/\text{GPa·mm·K}$, where the thermal expansion coefficient of the core substrate is set at $\alpha$, Young's modulus of the core substrate is E, a thickness of the core substrate is a, a sum of a thickness of the first interlayer insulation layer is b, and a sum of a thickness of the second interlayer insulation layer is c.

2. The printed wiring board according to claim 1, wherein the core substrate includes glass fiber, inorganic particles and resin.

3. The printed wiring board according to claim 1, wherein the core substrate includes inorganic particles in an amount of 20 wt. %~40 wt. %.

4. The printed wiring board according to claim 2, wherein the inorganic particles are made of silica or alumina.

5. The printed wiring board according to claim 1, wherein each of the first and second interlayer insulation layers does not contain glass fiber.

6. The printed wiring board according to claim 1, wherein the penetrating hole has a first opening portion having a first opening on the first surface and a second opening portion having a second opening on the second surface, the first opening portion tapers from the first surface toward the second surface, the second opening portion tapers from the second surface toward the first surface, and the first opening portion and the second opening portion are connected in the core substrate.

7. The printed wiring board according to claim 1, wherein the through-hole conductor includes a plating material filling the penetrating hole of the core substrate.

8. The printed wiring board according to claim 6, wherein a straight line passing through a gravity center of the first opening and perpendicular to the first surface of the core substrate is offset from a straight line passing through a gravity center of the second opening and perpendicular to the first surface of the core substrate.

9. The printed wiring board according to claim 1, wherein a sum of the thickness of the core substrate, the thickness of the first interlayer insulation layer and the thickness of the second interlayer insulation layer is in a range of 0.08 mm~0.60 mm.

10. The printed wiring board according to claim 1, wherein each of the thickness of the first interlayer insulation layer and the thickness of the second interlayer insulation layer is in a range of 0.01 mm~0.10 mm.

11. The printed wiring board according to claim 1, wherein each of the first and second interlayer insulation layers is multilayered.

12. The printed wiring board according to claim 1, wherein the first interlayer insulation layer formed on the first surface of the core substrate includes a first conductive via which extends through the first interlayer insulation layer such that the first conductive via is connected to a first end of the through-hole conductor and offset from a center of the through-hole conductor, and the second interlayer insulation layer formed on the second surface of the core substrate includes a second conductive via which extends through the second interlayer insulation layer such that the second conductive via is connected to a second end of the through-hole conductor and offset from a center of the through-hole conductor.

13. A method for manufacturing a printed wiring board, comprising:
- forming a penetrating hole for a through-hole conductor in a core substrate formed of a single layer;
- forming a first conductive circuit on a first surface of the core substrate;
- forming a second conductive circuit on a second surface of the core substrate on an opposite side with respect to the first surface;
- forming a through-hole conductor in the penetrating hole such that the through-hole conductor connects the first conductive circuit and the second conductive circuit;
- laminating at least one first interlayer insulation layer on the first surface of the core substrate; and
- laminating at least one second interlayer insulation layer on the second surface of the core substrate,
- wherein the core substrate has a thickness in a range of from about 0.06 mm to about 0.40 mm and a thermal expansion coefficient $\alpha$ in a range of from $5\times10^{-6}$ to $8\times10^{-6}$, and the core substrate, the first interlayer insulation layer and the second interlayer insulation layer satisfy an equation, $\alpha/(E\times(a+b+c))=0.5\times10^{-6}\sim2.5\times10^{-6}/GPa\cdot mm\cdot K$, where the thermal expansion coefficient of the core substrate is set at $\alpha$, Young's modulus of the core substrate is E, a thickness of the core substrate is a, a sum of a thickness of the first interlayer insulation layer is b, and a sum of a thickness of the second interlayer insulation layer is c.

14. The method for manufacturing a printed wiring board according to claim 13, wherein the forming of the through-hole conductor includes filling a plating material in the penetrating hole.

15. The method for manufacturing a printed wiring board according to claim 13, wherein the forming of the through-hole conductor includes filling an electrolytic plating material in the penetrating hole, the forming of the first conductive circuit and the forming of the second conductive circuit include forming electrolytic plated films of the first and second conductive circuits, and the forming of the through-hole conductor, the forming of the first conductive circuit and the forming of the second conductive circuit are conducted in a same process.

16. The method for manufacturing a printed wiring board according to claim 13, wherein the core substrate includes glass fiber, inorganic particles and resin.

17. The method for manufacturing a printed wiring board according to claim 13, wherein the core substrate includes inorganic particles in an amount of 20 wt. %~40 wt. %.

18. The method for manufacturing a printed wiring board according to claim 13, wherein the inorganic particles are made of silica or alumina.

19. The method for manufacturing a printed wiring board according to claim 13, wherein the first and second interlayer insulation layers do not contain glass fiber.

20. The method for manufacturing a printed wiring board according to claim 13, wherein the forming of the penetrating hole includes forming a first opening portion having a first opening on the first surface and forming a second opening portion having a second opening on the second surface such that the first opening portion tapers from the first surface toward the second surface, that the second opening portion tapers from the second surface toward the first surface, and that the first opening portion and the second opening portion are connected in the core substrate.

21. The method for manufacturing a printed wiring board according to claim 13, wherein a straight line passing through a gravity center of the first opening and perpendicular to the first surface of the core substrate is offset from a straight line passing through a gravity center of the second opening and perpendicular to the first surface of the core substrate.

22. The method for manufacturing a printed wiring board according to claim 13, wherein a sum of the thickness of the core substrate, the thickness of the first interlayer insulation layer and the thickness of the second interlayer insulation layer is in a range of 0.08 mm~0.60 mm.

23. The method for manufacturing a printed wiring board according to claim 13, wherein each of the thickness of the first interlayer insulation layer and the thickness of the second interlayer insulation layer is in a range of 0.01 mm~0.10 mm.

24. The method for manufacturing a printed wiring board according to claim 13, wherein each of the first and second interlayer insulation layers is multilayered.

25. The method for manufacturing a printed wiring board according to claim 13, further comprising:
- forming a first conductive via which extends through the first interlayer insulation layer such that the first conductive via is connected to a first end of the through-hole conductor and offset from a center of the through-hole conductor; and
- forming a second conductive via which extends through the second interlayer insulation layer such that the second conductive via is connected to a second end of the through-hole conductor and offset from a center of the through-hole conductor.

* * * * *